United States Patent [19]

Tepman

[11] Patent Number: 5,540,821
[45] Date of Patent: Jul. 30, 1996

[54] METHOD AND APPARATUS FOR ADJUSTMENT OF SPACING BETWEEN WAFER AND PVD TARGET DURING SEMICONDUCTOR PROCESSING

[75] Inventor: Avi Tepman, Cupertino, Calif.

[73] Assignee: Applied Materials, Inc., Santa Clara, Calif.

[21] Appl. No.: 92,847

[22] Filed: Jul. 16, 1993

[51] Int. Cl.⁶ ............... C23C 14/54; C23C 14/50; C23C 16/04; B65G 25/00
[52] U.S. Cl. .................. 204/192.13; 204/192.12; 204/298.03; 204/298.11; 204/298.15; 204/298.23; 204/298.29; 118/728; 118/500; 414/217; 414/218
[58] Field of Search .................. 204/298.03, 298.09, 204/298.15, 298.23, 298.24, 298.27, 298.28, 298.29, 192.12, 192.13, 192.15, 298.11; 118/728, 500; 414/217, 218

[56] References Cited

U.S. PATENT DOCUMENTS

| | | | |
|---|---|---|---|
| 4,382,739 | 5/1983 | Mack et al. ............... | 414/217 |
| 4,513,855 | 4/1985 | Fletcher et al. ........... | 198/473 |
| 4,590,380 | 5/1986 | Tamaki ...................... | 165/80.2 |
| 4,619,573 | 10/1986 | Rathmann et al. ........ | 414/222 |
| 4,632,624 | 12/1986 | Mirkovich et al. ....... | 414/217 |
| 4,746,256 | 5/1988 | Boyle et al. ............... | 414/217 |
| 4,801,241 | 1/1989 | Zajac et al. ............... | 414/786 |
| 4,861,222 | 8/1989 | Mirkovich ................. | 414/648 |
| 4,872,947 | 10/1989 | Wang et al. ............... | 156/643 |
| 4,894,132 | 1/1990 | Tanaka ....................... | 204/298.03 |
| 4,902,531 | 2/1990 | Nakayama et al. ....... | 427/570 |
| 4,915,564 | 4/1990 | Eror et al. ................. | 414/217 |
| 4,923,584 | 5/1990 | Bramhall, Jr. et al. ... | 204/298.25 |
| 5,051,054 | 9/1991 | Wagner et al. ........... | 204/298.27 |
| 5,098,198 | 3/1992 | Nulman et al. ........... | 374/121 |
| 5,108,570 | 4/1992 | Wang ......................... | 204/192.15 |
| 5,131,460 | 7/1992 | Krueger ..................... | 250/442.1 |

FOREIGN PATENT DOCUMENTS

| | | |
|---|---|---|
| 0272140 | 12/1987 | European Pat. Off. . |
| 0272140A2 | 6/1988 | European Pat. Off. . |
| 0595624A1 | 5/1994 | European Pat. Off. . |
| 3-75361 | 3/1991 | Japan . |
| 4-329876 | 11/1992 | Japan . |

*Primary Examiner*—R. Bruce Breneman
*Assistant Examiner*—Rodney G. McDonald
*Attorney, Agent, or Firm*—Donald Verplancken; B. Todd Patterson

[57] ABSTRACT

A heater and pedestal actuator is provided to actuate the pedestal of a deposition chamber from a first position wherein a wafer may be placed thereon to a second position adjacent to the deposition target. To adjust the inward travel of the heater to compensate for target erosion, the actuator includes a worm drive apparatus driven by a stepper motor. The worm drive is pitched, and the stepper motor is selected, to allow fine movement of the heater on the order of less than 0.01 mm for each arcuate step of the stepper motor. A computer is used to actuate the stepper motor, and cause additional stepper motor actuation, to increase the travel of the heater toward the target to compensate for target erosion. Additionally, the computer may vary the speed of the worm drive rotation, to create different heater travel speeds within the chamber.

50 Claims, 4 Drawing Sheets

METHOD AND APPARATUS FOR ADJUSTMENT OF SPACING BETWEEN WAFER AND PVD TARGET DURING SEMICONDUCTOR PROCESSING

BACKGROUND OF THE INVENTION

The present invention relates to the processing of integrated circuit wafers and equipment useful for such processing. More particularly, the present invention relates to processes and equipment for coating integrated circuit wafers which compensate for target erosion which occurs during consecutive wafer coating operations. The invention maintains a consistent distance between the wafer and the target as consecutive wafers are coated from the same target and thus maintains a consistent and predictable coating thickness from wafer-to-wafer over the useful life of the target. The present invention is also directed to processing equipment which may be used to decrease the processing cycle time for each wafer processed with the processing equipment, and thus increase the productivity of the processing equipment.

To sputter coat a deposition layer onto a substrate such as a wafer in a sputter chamber, a robot arm places a wafer onto a receiver which is located in the chamber to position the wafer over a resistance-heated support member commonly referred to as a "heater". The heater moves through the receiver to position the wafer thereon (the first or lower position), and then moves upwardly into a second, upper position in close, preselected proximity with the target for deposition of the coating on the wafer. As the wafer is moved from the first position to the second position, it passes through a hanger on which a cover ring is suspended, and the wafer engages the ring and lifts the ring off the hanger.

To ensure proper coating characteristics, the top of the wafer should be located approximately 30 to 80 mm from the face of the target, and the edge of the wafer is masked by the ring to prevent passage of the reactive plasma in the chamber to the underside of the wafer. The actual target-to-wafer distance is selected to establish the required coating thickness and properties, and this established distance must be maintained with minimal deviation as each subsequent wafer is processed with the same target. However, as wafers are sequentially coated using the same target, the surface of the target is eroded, thereby causing the target to become physically smaller. Thus, the target-to-wafer distance increases unless the heater is moved further upward to compensate for target erosion.

To move the heater from the lower position at which it receives the wafer to the upper position at which the wafer is processed, a pedestal is connected to the underside of the heater and has a shaft extending out the bottom of the chamber where it is driven by a positioning device. A physical stop is provided in the positioning device to engage a finger on the pedestal to limit upward movement of the pedestal shaft into the chamber. By adjusting the location of this physical stop, the amount of travel of the pedestal from the first position to the second position before the physical stop engages the finger may be varied, and thus the travel of the heater inwardly of the chamber can be controlled. As the target erodes and the distance between the target and wafer increases, the location of the stop may be manually adjusted to increase the travel of the heater and thus reestablish the proper distance between the wafer and target. Eventually, the target will erode to a point where it must be replaced. In most instances, the target must be replaced after 20 mm of erosion has occurred.

To establish the initial target-to-wafer distance, and to re-set that distance by adjusting the stop, a number of wafers may be processed, and the thickness of the deposition layer created thereon may be measured, so that the stop may be finely adjusted to establish the target-to-wafer distance which provides the desired deposition thickness. To establish the desired deposition layer thickness, which results at the proper wafer-to-target distance, several wafers may be run, and the stop adjusted, until the deposition is optimized. In part as a result of the physical limitations of the mechanical stop, the acceptable tolerance on the desired wafer-to-target distance is one min. Thus, when the target erodes a sufficient amount to cause the deposition layer on the wafer to approach an unacceptable thickness, the stop is moved to compensate for that target erosion. It is contemplated to move the stop in increments of up to one mm to compensate for target erosion. To accomplish this adjustment, the processing in the chamber must be stopped, and a technician must make a manual adjustment to move the stop the desired distance.

It should be appreciated that a 1 mm adjustment of the target-to-wafer distance will result in an overall change of between 3% and 1.25% of the total wafer-to-target distance. This change could result in substantial differences in deposition thickness between the last wafer processed before adjustment and the first wafer processed after adjustment.

In one prior-art device, a worm drive is used to move a susceptor in a chemical-vapor deposition (CVD) chamber. However, no provision is necessary in that device to incrementally compensate for target erosion from wafer to wafer.

In another prior-art device, the positioning device moves the pedestal through a pneumatic piston actuator which is disposed parallel to the pedestal shaft. A control rod extends from the piston actuator and terminates in a crossbar which is also linked to the pedestal shaft. The pedestal shaft has two positions: the pedestal-retracted position, in which the piston control rod is fully extended to hold the pedestal down in the retracted position and thus the heater in the first position; and, the pedestal-extended position, wherein the piston control rod is retracted into the pneumatic piston to move the pedestal upwardly in the chamber until the stop engages a manually adjustable limit finger on the pedestal, and thus positions the heater in the second position. Again, no provision is made to incrementally compensate for target erosion from wafer to wafer.

This prior-art method and apparatus for controlling the wafer-to-target distance has several disadvantages. Adjustment of the wafer-to-target distance may only be accomplished when wafer processing is stopped, by adjusting the location of the stop to permit greater pedestal travel before the finger engages the stop. Further, even after the stop is adjusted, the effect of the adjustment must often be evaluated empirically by measuring deposit thickness, and at times further adjusted, before the wafer-to-target distance is properly established. As the wafer-to-target distance commonly must be adjusted after every 100 wafers, the adjusting process is time-consuming and expensive. Additionally, the movement of the heater and wafer from the first position to the second position must be accomplished at a relatively low rate of speed, to ensure that the engagement of the wafer against the cover ring does not cause the wafer to chip or crack. Because the pedestal speed of the prior-art devices is not adjustable while the heater and wafer thereon are in motion, the entire movement of the heater and wafer is governed by the maximum permissible engagement speed of the wafer against the cover ring. This results in substantial dead time during processing, while the pedestal slowly moves the heater up to engage the cover ring on the wafer and then position the wafer adjacent to the substrate for processing.

Wang et al. in U.S. Pat. No. 4,872,947 describe a CVD plasma reactor in which the wafer is supported on one electrode which can be variably spaced from the other electrode to better control the plasma.

SUMMARY OF THE INVENTION

In view of the forgoing, it is an object of the invention to provide an apparatus for finely adjusting the wafer-to-target distance over the life of the target to ensure consistent deposition formation without the need to manually adjust the inward travel of the pedestal to compensate for target degradation or erosion. It is another object of the invention to provide an apparatus which permits variation in the travel speed of the heater during the movement of the heater from the first position to the second position and thus allow relatively fast heater travel prior to the engagement of the wafer against the cover ring, followed by relatively slow heater travel as the wafer engages the cover ring.

In accordance with the invention, an apparatus is provided to automatically increase the travel of the heater from the first position wherein the wafer is received on the heater to the second position wherein the wafer is positioned adjacent the target, to compensate for target erosion resulting from the processing of the immediately preceding wafers, and to vary the travel speed of the heater as the heater moves the wafer within the chamber for processing.

In the preferred embodiment, the apparatus is configured for sputter coating, and includes a chamber having a fixed sputtering target therein, a heater disposed in the chamber which receives the wafer thereon for processing, a pedestal assembly interconnected to the heater and extending outwardly from the chamber, and an actuator connected to the pedestal to move the heater from the first position to the second position and initiate additional travel of the heater from the first position to the second position to compensate for target erosion as wafers are processed in the chamber.

In one embodiment of the invention, the actuator is a worm drive interconnected to a stepper motor, and a controller is provided to step the motor additional steps, and thus increase the rotation of the worm drive, as the target erodes. This additional rotation is translated into linear motion of the pedestal, and thus induces additional movement of the heater toward the target to compensate for target erosion. The controller may be programmed to increase the travel of the heater to compensate for target erosion after each wafer is processed, or after a discrete number of wafers are processed.

Additionally, the use of a controller, in conjunction with a motor drive, permits the use of different heater travel speeds during the processing of each wafer. The controller signals the motor to move the heater at a first, relatively high speed to position the heater and wafer adjacent the cover ring, and then signals the motor to move the heater and wafer at a relatively low speed to engage the cover ring and move the heater, wafer and cover ring thereon into position adjacent to the target for processing.

BRIEF DESCRIPTION OF THE DRAWINGS

These, and other objects and advantages of the invention will be apparent from the following description when read in conjunction with the accompanying drawings, wherein.

DETAILED DESCRIPTION OF THE PREFERRED EMBODIMENTS

Figure 1:
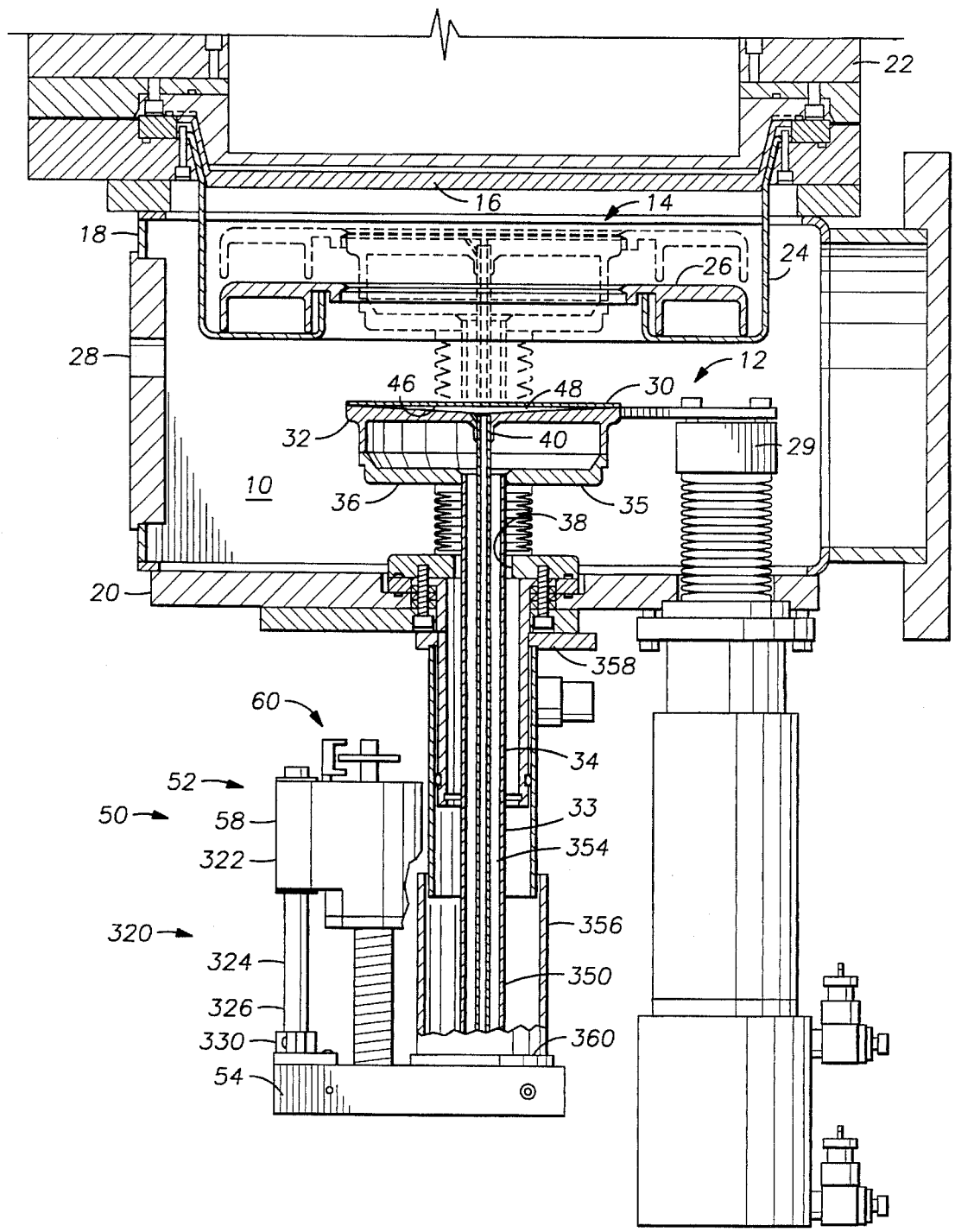
FIG. 1 is a sectional view of a sputtering chamber, showing the actuating system of the present invention attached thereto in partial cutaway.

Referring to FIG. 1, a sputtering chamber 10 is shown coupled to a pedestal and heater actuator 50 for moving a wafer 30 from a first position 12 at which a wafer 30 is received upon a heater plate 32 at a distance from the sputtering target 16, to a second position 14 adjacent to the sputtering target 16 at which the wafer 30 is processed.

Sputtering chamber 10 includes an outer, generally cylindrical wall 18 interconnected to a lower, generally circular base 20 and a cover 22, disposed over wall 18 opposite to the base 20. Cover 22 includes target 16 suspended therefrom, and a wafer cover ring hanger 24, including wafer cover ring 26 suspended thereon, projecting downwardly into chamber 10 from cover 22 and in alignment with target 16 and heater plate 32. Wall 18 also includes a slit valve 28 therein. A wafer receiver apparatus 29 is disposed within chamber 10 to receive a wafer 30 for processing in chamber 10. A robot arm (not shown) may enter chamber 10 through slit valve 28 to place a wafer 30 on wafer receiver apparatus 29 therein.

To move the wafer 30 from the first, lower position 12 a distance from target 16 to a second, upper position 14 adjacent target 16 for sputtering a deposition layer thereon, the heater plate 32 is disposed inside of the chamber 10 and is interconnected to the upper terminus of an axially movable pedestal 34. Heater plate 32 is preferably heated by an electrical resistance heater disposed therein. Pedestal 34 includes a tubular extending rod portion 33 and a generally circular plate portion 35 disposed on the upper terminus of rod portion 33. Plate portion 35 is attached to the underside 36 of heater plate 32 and rod portion 33 extends outwardly from the chamber 10 through an aperture 38 in chamber base 20. Receiver apparatus 29 is positioned to receive wafer 30 from a robot and supports the wafer 30 over heater plate 32. Pedestal 34 is movable through aperture 38, and may be moved to pass heater plate 32 through receiver apparatus 29 and thus locate the wafer 30 on heater plate 32 at the lower position 12, and then may be moved further inwardly and upwardly of aperture 38 to locate the wafer 30 on heater plate 32 in the upper position 14 adjacent to the target 16 for sputtering. Chamber 10 also includes a gas inlet, a gas outlet, and a vacuum source. During sputtering operations, the chamber 10 is evacuated to a very low pressure, nearly a vacuum, and the wafer 30 is moved from the lower position 12 into the upper position 14 adjacent to the target 16 for processing. An RF source is energized while gas is supplied into chamber 10. The RF energy ionizes the gas to form a plasma. Ions in the plasma are electrostatically attracted to the target 16 and sputter or dislodge target material, which in turn coats the wafer 30 to thereby deposit a desired layer of target material on wafer 30. Wafer 30 is then withdrawn by heater plate 32 from the upper position 14 to the lower position 12, at which the wafer 30 is returned to receiver apparatus 29 and may be removed through the slit valve 28 by a robot, or additionally processed within the chamber 10.

As the wafer 30 is moved upwardly from the lower position to the upper position 14 on heater plate 32, the edge of wafer 30 engages the inner diameter of a cover ring 26 suspended on a cover ring hanger 24 and lifts cover ring 26 off hanger 24 and carries it upwardly with wafer 30 to the second, upper position 16. The cover ring 26 shields the edge of the wafer 30 to limit the deposition of a layer on the edge and underside thereof, and also blocks off the interior of chamber 10 below cover ring 26, and thus limits the formation of a deposition layer on the interior of chamber 10. Heater plate 32 includes an upper, inwardly spherical portion 46, which is ported, via tubing 40, to a supply of non-reactive gas, such as argon. Shield 26 and spherical portion 46 cooperate with wafer 30 to form a pocket 48 between wafer 30 and heater plate 32, into which pressurized argon or other non-reactive gas is injected to prevent deposition of a layer on the underside of the wafer 30 and provide a heat transfer mechanism to thermally couple wafer 30 to heater plate 32. The gas must be supplied under pressure, as some portion thereof will leak outwardly beyond the edge of wafer 30 and past shield 26. The passage of gas past wafer 30 edge and shield 26 also helps prevent deposition on the edge of wafer 30.

Figure 2:
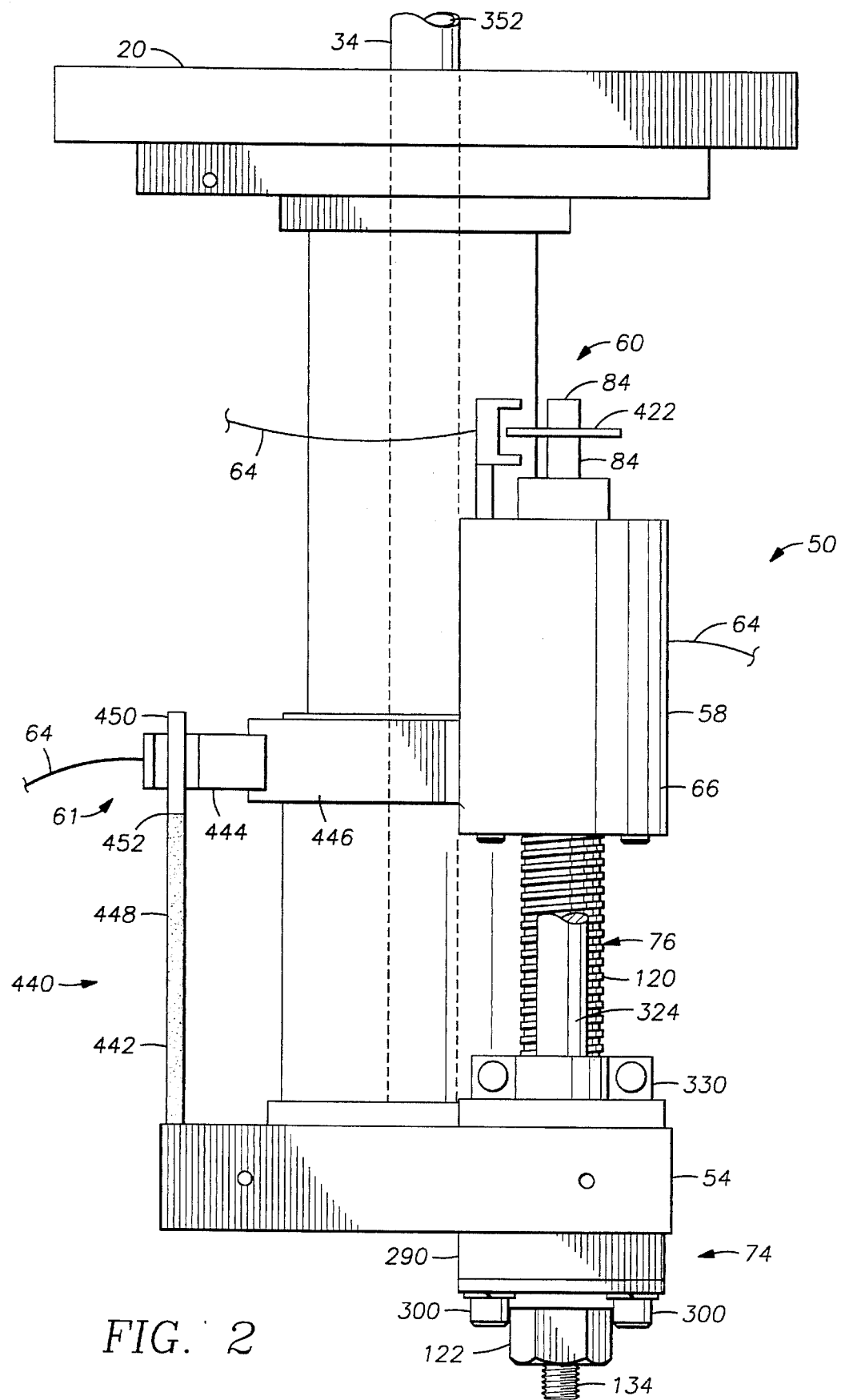
FIG. 2 is a enlarged plan view of the actuating system of FIG. 1 disposed to position the heater in the first position.
Figure 3:
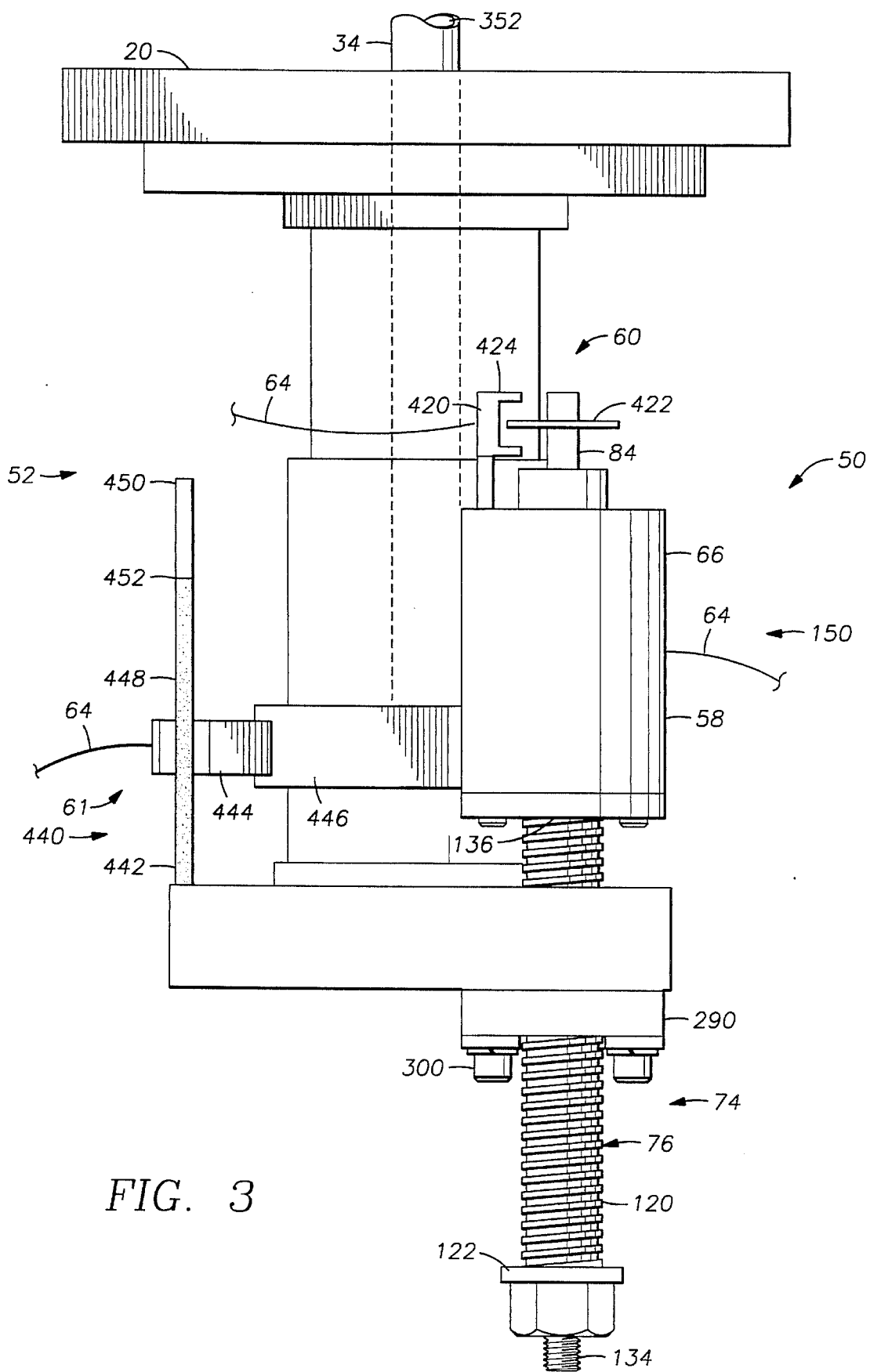
FIG. 3 is an enlarged plan view of the actuator of the present invention disposed to position the heater in the second position.

Referring now to FIGS. 1 through 3, the mechanisms of pedestal and heater actuator 50 for moving heater plate 32 and wafer 30 thereon from the lower position 12 to the upper position 16 are shown. Pedestal and heater actuator 50 includes a motion actuator 52 which has a fixed part attached to the chamber base 20 and a movable part mechanically linked to a motion transfer arm 54. The motion transfer arm 54 is also interconnected to the base of rod portion 33 of pedestal 34. When motion actuator 52 is actuated, it moves motion transfer arm 54 attached to the lower end of rod portion 33 of pedestal 34, and thus moves rod portion 33 either inwardly and outwardly of chamber 10 to position heater plate 32 in either the lower 12 or the upper position 14.

Figure 5:
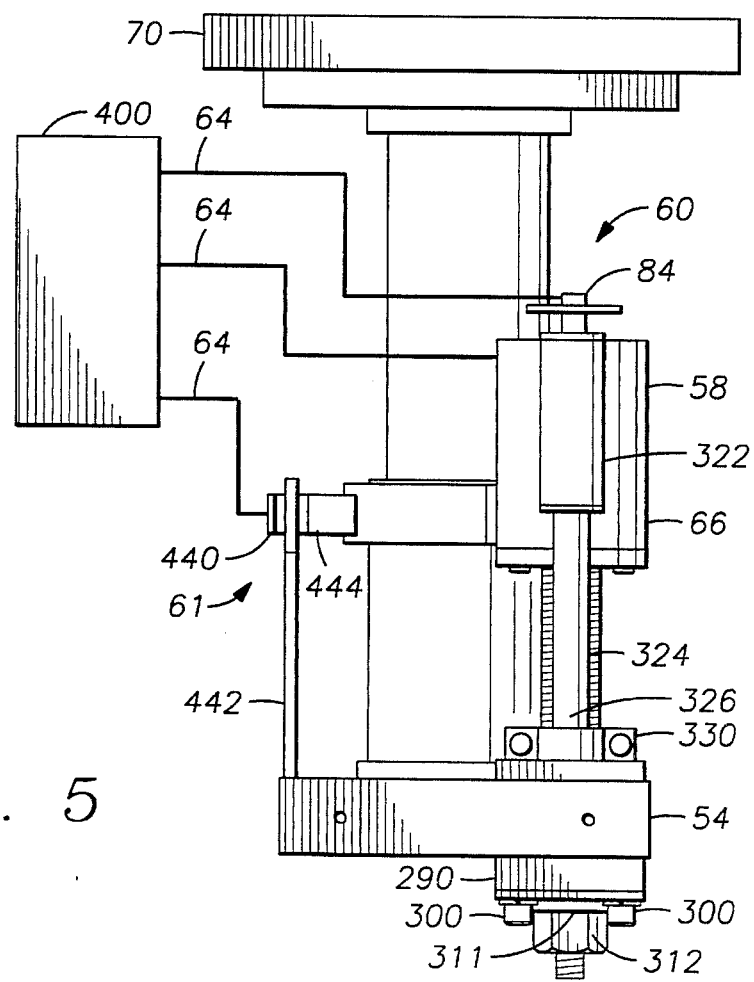
FIG. 5 is a schematic of the chamber, actuator and computer control system of the present invention.

Motion actuator 52 includes a drive assembly 58, read assemblies 60 and 61 for mechanically determining the state of the apparatus and an interactive controller 400 interconnected to the read assemblies 60 and 61 and to the drive assembly 58 with communication cables 64 (FIG. 5). Controller 400 activates drive assembly 58 to cause movement of motion transfer arm 54 to move pedestal 34 and heater plate 32 thereon, and determines and controls the movement and positioning of heater plate 32 through read members 60, 61. In the preferred embodiment, drive assembly 58 includes a motor 66. However, other drive assembly 58 configurations may be employed without deviating from the scope of the invention.

Referring now to FIG. 2, in a preferred embodiment drive assembly 58 is interconnected to transfer arm 54 by worm drive 76. When drive assembly 58 is actuated, worm drive 76 is rotated and that rotational motion is translated through worm drive 76 into linear motion of transfer arm 54 and pedestal 34 attached thereto. Drive assembly includes a motor 66 to drive worm drive 76. Drive assembly 58 is rigidly fixed to chamber 10 by a bracket, or other member (not shown).

FIGS. 2 and 3 show the worm drive 76 at two different positions, received in and extending from drive assembly 58. Worm drive 76 includes a major diameter worm track portion 120 at its center, and is supported at its upper end in drive assembly 58. In the preferred embodiment, the drive assembly 58 includes a separate stepper motor coupled to a bearing case, which receives the upper end of worm drive 76 therein. The bearing case includes bearings which are piloted into bores within the case, which receive the upper end of worm drive 76 therein. A pulley and belt configuration is used to transfer rotary motion of the motor to the worm drive 76. Worm drive 76 also includes a lower extending portion 122 which extends from the lower end of worm track portion 120 to terminate at first shaft end 134, which is threaded about its circumference.

Rotary worm drive motion is translated into axial motion of driven section 74 located at the bottom of actuator 50 to drive pedestal 34. Driven section 74 includes a plastic nut 290 threaded over worm drive 76 and connected to motion transfer arm 54. Motion transfer arm 54 includes a through aperture into which worm drive 76 projects, and plastic nut 290 is threaded on the portion of worm drive 76 projecting therethrough. Plastic nut 290 includes an inner, helically-splined aperture which engages on worm drive portion 120 of worm drive 76. Nut 290 is affixed to transfer arm 54 by a plurality of bolts 300. To prevent movement of driven section 74 past the lower end of worm drive 76, a washer and nut are disposed over a lower shaft end 134 and secured against the lower end of worm drive 76.

Referring now to FIGS. 1 and 5, a reaction bracket and sleeve assembly 320 prevents rotary motion of transfer arm 54 otherwise induced by rotation of the worm drive 76 and thus of nut 290 attached. This sleeve assembly 320 includes a sleeve 322, formed as an integral part of drive assembly 58 and extending vertically in parallel with worm drive 76. A reaction rod 324 passes through sleeve 322 and is connected at the lower end 326 thereof to transfer arm 54 by means of rod base 330.

Transfer arm 54 is interconnected to, and actuates, pedestal 34 to move heater plate 32 to compensate for target erosion. Pedestal rod portion 33 includes a base 350 which is rigidly connected to transfer arm 54. The portion of pedestal rod portion 33 extending below chamber base 20 is surrounded by a telescoping RF shield 356, which includes a series of telescoping tubes substantially larger in circumference than pedestal rod 33, and terminating at their upper end in a chamber plate 358 which is connected to the underside of chamber 10, and terminating at their lower end in a base plate 360 connected to transfer arm 54. A gas supply line 40 and vacuum supply lines (not shown) may be fed through the hollow core 354 of pedestal rod portion 33 into the pocket 48 formed between of heater plate 32 and wafer 30. The injection of gas under the wafer 30 helps prevent accumulation of deposition materials on the edge or underside of wafer 30, and promote thermal transfer between heater plate 32 and wafer 30.

Vertical movement of heater plate 32 within chamber 10, by actuation of the motor 66 in drive assembly 58, will now be described with reference to FIGS. 1 to 3. In FIGS. 1 and 2, pedestal and heater actuator 50 is positioned to locate the heater plate 32 in the lower, first position 12. In FIG. 3, pedestal and heater actuator 50 is moved to locate heater plate 32 (not shown in FIG. 4) in the upper, second position 14. Motor 66 responds to input signals, and turns a discrete arcuate distance in response to a single input signal, and a second bi-polar directional signal. In the preferred embodiment, motor 66 is a stepper motor, and a pulsed signal is sent by a controller 400 through one of signal cables 64. Each step of the motor 66 in response to a signal pulse rotates output shaft 84 a discrete amount. Controller 400 is preferably based on a VME bus. The rotary movement of motor output shaft 84 rotates the worm drive 76. The rotary motion of worm drive 76 is transferred via worm track portion 120 and helical splines in nut 290 into axial movement of transfer arm 54. As nut 290 is rotationally fixed with respect to transfer case 80, because transfer arm 54 is rotationally fixed via rod 324 in sleeve 322, rotary motion of the worm drive 76 with nut 290 vertically moves the nut 290 and reaction arm 54 attached thereto with respect to worm drive 76. As worm drive 76 is substantially parallel to pedestal rod portion 33, equal axial movement occurs in pedestal 34 and heater plate 32 attached thereto. In the preferred embodiment; the pitch of worm track portion 120, and rated number of steps of motor 66 per complete revolution thereof, will result in movement of heater plate 32 of less than 0.01 mm per motor 66 step.

Thus, to move heater plate 32 from the lower, retracted position 12 to the extended, upper position 14 adjacent to the target, motor 66 will receive sufficient pulses, in a continuous square or sine-wave from controller 400, which will cause motor 66 to move almost continuously to move heater plate 32 into position for wafer processing. After processing is complete, motor 66 will be actuated, by an equal number of pulses from controller 400, to rotate in the reverse direction and thus pull heater plate 32 away from the target.

To fully exploit the invention, the controller 400 is placed into an interactive mode, wherein it detects the position of the heater plate 32, and thus the wafer 30, and compensates for target erosion without manual adjustment. To operate in an interactive mode, the controller 400 must be able to determine, and control, the position of the heater plate 32 at any time. Referring to either FIGS. 2 or 3, read member 60 includes a counter 420 and read member 61 includes a resettable zero apparatus 440, which provide data to allow the controller 400 to determine and control the position of heater plate 32 within chamber 10.

The zero apparatus 440 includes an upright zero position read blade 442 mounted on transfer arm 54 and extending substantially perpendicular thereto, and a zero position read head 444 which is attached to drive assembly 58 by arm 446. Arm 446 holds sensor 444 in a fixed position in relation to drive assembly 58. Sensor 444 is a light-sensitive sensor or opto-coupling, which is capable of detecting a sharp differential in the reflectivity of a material moving within the read field thereof. Blade 442 includes a first darkened portion 448 and a second, light portion 450 which meet to form a boundary at a transverse line 452. First, darkened portion 448 and second, light portion 450 have different reflectivity. A cable 64 interconnects read sensor 444 and controller 400.

In the event of a power failure, or, when the chamber 10 is first energized, controller 400 will have insufficient information in its electronic memory to establish a base line, or zero position, for establishing the travel of heater plate 32 into position the proper distance from target 16 for sputter coating. Therefore, when power is established, controller 400 will pulse motor 66 to move transfer arm 54 up or down, and thus move blade 442 up or down within sensor 444. When transverse line 452 passes into registration with the center of the sensor 444, the sensor 444 transmits a signal to the controller 400, and the controller 400 stops sending pulses to motor 66 and thus movement stops. The individual components of pedestal and heater actuator 50, pedestal 34, heater plate 32 and target 16 have tolerances such that the positioning of transverse line 452 on blade 444 establishes a "zero" position for the top of a wafer 30 on heater plate 32 in the lower position 12.

Figure 4:
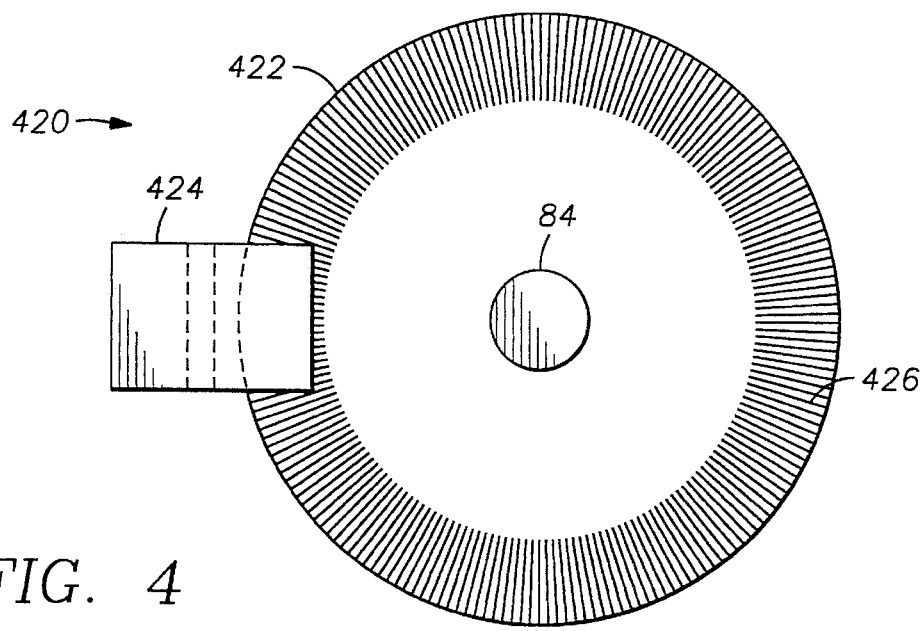
FIG. 4 is a plan view of the counter used with the actuator of the present invention.

Referring now to FIGS. 2, 4, and 5, counter 420 is physically interconnected to motor shaft 84 and electrically interconnected to controller 400 by cable 64. Counter 420 includes a primarily light-colored disc 422 attached to shaft 84 extending axially outwardly from motor 66, but having a plurality of radially extending dark lines 426 disposed about the upper portion thereof adjacent to the outer circumference thereof. A counter read head or sensor 424 is attached to motor 66 and has a slot through which the edge of disc 422 can rotate. Disc 422 preferably includes the same number of radial lines 426 as the number of steps required for one stepper motor revolution. Each of radial lines 426 have a different reflectivity than the base color of disc 422.

As motor 66 receives a pulse from controller 400, motor 66 turns shaft 84 and worm drive 76, and thus causes axial movement of pedestal 34 and rotational movement of disc 422. The movement of disc 422 causes a light and a dark line to pass through the read area of counter 420, which causes counter 420 to send a pulse to controller 400 to signal the completion of a step of motor 66. Controller 400 will tabulate return pulses for each sent pulse, and if a return pulse is not received from counter 424 in response to a sent pulse, it will shut down the pedestal and heater actuator 50 and indicate a fault.

Referring again to FIG. 1, pedestal and heater actuator 50 is used to vertically locate the heater plate 32 within a desired distance, and tolerance, from the target 16. In sputter deposition, the wafer 30 must be located at a preselected distance (the second, upper position 14) within the range of 30 mm to 80 mm from the target 16, and to ensure wafer-to-wafer consistency, the next wafer and each subsequent wafer must be closely maintained to that preselected distance. The actuator 50 of the present invention is particularly well suited to so position the heater plate 32 and wafer 30 thereon, with better precision than the hydraulic ram of the prior art. Importantly, the extent of travel of the heat, and thus the wafer-to-target spacing, can be adjusted without breaking the vacuum of the processing chamber. Also, the motor is advantageously located outside the chamber to thereby minimize contaminants.

To actuate the heater plate 32 into position when a new target is installed, controller 400 actuates actuator 50 to position transverse line 452 in sensor 444 to "zero" the system. Controller 400 then determines a travel distance, and generates the number of pulses to motor 66 necessary to move transfer arm 54, and pedestal 34 and heater plate 32 attached thereto, that same distance into position for processing. Controller 400 verifies that the correct number of steps have occurred, by monitoring return pulses from counter 420. When the correct number of pulses are sent to move heater plate 32 from first position 12 to second position 14, and a corresponding number of returned pulses are received, the controller 400 stops sending pulses and thus stops moving the motor 66. When processing is complete, an equal number of return pulses are sent and read by the controller 400, to actuate motor 66 in the reverse direction and thus move heater plate 32 down into position adjacent to the slit valve 28 so that the completed wafer 30 may be removed and a new wafer 30 may be placed thereon. Controller 400 verifies the return of heater plate 32 to the first position 12 through sensor 444.

To compensate for target erosion, controller 400 sends additional pulses, to cause heater plate 32 to move further from the first position 12, and thus compensate for erosion of the target 16. Rather than manually adjust the controller 400, it is contemplated that controller 400 automatically compensates for the erosion.

For example, the controller 400 may be preprogrammed with an "erosion curve," established from experiment, which allows the computer to compensate incrementally from wafer to wafer for the expected target 16 erosion. In one embodiment, the controller 400 simply counts every wafer 30 since a new target 16 was installed in the chamber 10, pulls from its memory the expected erosion from the cumulative wafer processing, and adds a number of pulses to the sent pulses necessary to compensate for that erosion by further actuating motor 66. For example, in this embodiment, if the stored data indicate that total target erosion as a result of the cumulative wafers processed should be 0.5 mm, the controller 400 will generate sufficient additional pulses and the heater plate 32 will move an additional 0.5 mm from the nominal upper position 14 further upwardly toward target 16 to process the next wafer 16. An equal number of additional pulses is added in the retract step. Thus, throughout the expected life of the target 16, target erosion is compensated for by additional heater plate 32 travel without the necessity for manual intervention to adjust parts of the chamber 10. Further, target 16 erosion may be compensated for before a full millimeter of erosion has occurred, and thus the part-to-part processing consistency of the wafers 30 substantially increased, by substantially reducing the need to make major, i.e., one mm, adjustments to compensate for target 16 erosion. Although the target-to-wafer separation is optimally adjusted for each new wafer, major benefits of the invention can be obtained if the distance is adjusted every few wafers.

The above simple automated erosion compensation assumes that all wafers are deposited with the same thickness of sputtered material, which is not necessarily true over the life of a target. Simple monitoring schemes can indirectly determine the amount of target erosion. The controller 400 may be programmed to accumulate the total number of kilowatt-hours of RF power applied to the plasma used in sputtering the particular target. This value is closely related to the total amount of erosion of the target. Of course, at constant RF power, only a cumulative sputtering time is required. Alternatively, an end-point detector may dynamically measure the thickness of material being deposited so that the deposition process is terminated at a precisely determined thickness. The controller 400 may be programmed to accumulate these measured thicknesses for a particular target, which value is closely related to target erosion. A calibration procedure optimizes the relationship between any of these values and the additional distance the heater needs to move the wafer. All these methods measure a cumulative operational value of the sputtering apparatus since the installation of a fresh target.

In addition to providing wafer-to-wafer adjustment of the target to wafer distance, the pedestal and heater actuator 50 may be used in combination with controller 400 to vary the speed of pedestal 34, and thus heater 32 and wafer 30 thereon, during the movement of the heater 32 from the first position 12 to the second position 14, and thus move the heater at a first, high speed, from the first position to a position just prior to engagement with the ring 26, and then at a lower speed to engage the ring 26 on the wafer 30 and move the wafer 30 into second position 14 adjacent to target 16 for processing. To move heater 32 at differential speeds, computer 400 sends signal pulses to motor 66 at a first, higher rate, thus causing motor 66 to rotate shaft 84 and worm drive 76 at a relatively high rate of speed to move transfer arm 54, and pedestal 34 thereon, at a corresponding high speed. Controller 400 is programmed with the distance from the first position to the ring 26, and thus transmits sufficient pulses to motor 66 to move heater 32 the appropriate distance at the high speed to position the wafer 30 just under the ring. Then, controller 400 transmits pulses at a slow rate, corresponding to the proper engagement speed of the wafer 30 against ring 26, and continues to move heater 32 at that low speed to move heater 32 from just below ring 26 into the contact of the wafer 30 with the ring 26. After contact, the speed may be increased until the heater 32 assumes its second, upper position 14. A corresponding variable speed may be directed by controller 400 to retract heater 32 and wafer 30 from the second position 14. When the wafer 30 is about to a position where the ring 26 contacts and is received on hanger 28, the speed of the heater is reduced to a low speed, and thereafter the speed of the heater 32 is increased speed to fully retract the heater 32 to the first, lower position. The lower speed at contact reduces shock and thus lowers particulate production. However, the higher speed otherwise speeds increases production throughput.

The concept of the variable speed of the heater or other wafer support may be applied to other deposition apparatus in which the wafer contacts a clamp or shield, such as that described by Krueger in U.S. Pat. No. 5,131,460, or shadow ring. Such shadow rings are used in chemical vapor deposition. The concept is also applicable to any movable part within a deposition chamber in which the movement causes two parts to impact one another, particularly where one of them is a silicon wafer, for example a support ring or support fingers which lift a wafer off a robot paddle.

Although a controller 400 interconnected to counter 420 and zero apparatus 440 has been described for initiating compensating movement of the heater plate 32 in response to target 16 erosion, other controllers, including electrical, pneumatic, hydraulic or mechanical devices, could be substituted for the controller 400.

Although a preferred embodiment is described herein, one skilled in the art may change sizes and materials thereof without deviating from the scope of the invention. For example, the sensors 60 may be changed, and controller 400 eliminated altogether, or actuators other than a motor 66 and incremental motion actuators other than worm drives 76 may be used, without eliminating the improvement to the pedestal and heater actuator 50. Additionally, mechanical means may be used to cause additional incremental movement of the heater plate 32 in response to target 16 erosion, or, a physical stop may be used to limit the travel of the pedestal, and the position of stop itself may be incrementally changed to allow additional pedestal movement to compensate for target erosion. Further, the advantages of the invention may be enjoyed by compensating for erosion after each wafer is processed, or, after small groups of wafers are processed.

These and other advantages of the above-described invention will be apparent to those skilled in the art, and such persons will appreciate that the foregoing preferred embodiment may be modified without deviating from the scope of the invention.

I claim:

1. An apparatus for compensating for target erosion occurring during sequential processing of substrates in a chamber having a deposition target therein, comprising:

a substrate support member disposed within the chamber having an end portion extending from the chamber, said substrate support member movable between a first position to receive a substrate thereon and a second position adjacent the target to position a substrate thereon for processing;

said second position defining a mean distance between the substrate and the target; and a drive member interconnected to said end portion to move said substrate support member between said first position and second position, said drive member including a logic member responsive to the amount of target erosion resulting from previous processing with the target to cause the drive member to vary the travel of said substrate support member thereon between the first position to the second position to maintain the second position at the mean distance from the target to compensate for target erosion as substrates are sequentially processed with the target.

2. The apparatus of claim 1, wherein said logic member includes a control member which accumulates an operative sputtering value during use of the target that is related to an amount of erosion of the target.

3. The apparatus of claim 2, wherein the control member includes a computer.

4. The apparatus of claim 3, wherein said logic member further includes a counter disposed on said drive member interconnected to the computer to measure the movement of the drive member.

5. The apparatus of claim 1, wherein said logic member further includes a zeroing apparatus to position the substrate support member at a zero position without reliance on an electronically stored value of a previous state of said apparatus.

6. The apparatus of claim 1, wherein said drive member includes a worm drive.

7. The apparatus of claim 6, wherein said support member includes a transfer arm disposed on said end portion, said transfer arm including a threaded hole therethrough engageable with said worm drive.

8. An apparatus for positioning substrates within a chamber at a mean distance from the surface of a target therein, and maintaining that mean distance with successively processed substrate as the target erodes during substrate processing, comprising:

a movable support member receiving a substrate thereon;

a drive member connected to said support member and actuable to move said support member to a mean distance from the target; and a control member responsive to the amount of target erosion resulting from processing of successively processed substrates interconnected to said drive member and controlling the actuation of said drive member to compensate for target erosion by positioning said support member at the mean distance from the target as each substrate is successively processed with the target.

9. The apparatus of claim 8, wherein said support member includes a pedestal having a first end receiving said substrate and a second end projecting out of the chamber.

10. The apparatus of claim 9, wherein said control member further includes a position read member, and said drive member receives inputs from said position read member to determine the location of said support member in said chamber.

11. The apparatus of claim 10, wherein said control member further includes a computer wherein said position read member includes a zero position sensor which transmits a signal to said computer when said support member is in a fully retracted position from the target.

12. The apparatus of claim 11, wherein said position read member further includes a movement sensor which transmits a signal to said computer corresponding to a discrete movement of said support member in the chamber.

13. The apparatus of claim 12, wherein said computer actuates said drive member to establish said support member at a zero position, and then actuates said drive member to move said support member from said zero position to a position at the mean distance from said target.

14. The apparatus of claim 13, wherein the computer initiates additional movement of said support member, corresponding to the depth of erosion of the target resulting from all substrates previously processed with the target, as the drive member moves the support member from the zero position to the mean distance from the target.

15. The apparatus of claim 14, wherein said drive member includes a worm drive.

16. A method of positioning a substrate support at a mean distance from the surface of a target in a processing chamber as the target erodes as a result of the consecutive processing of substrates with the target, comprising:

connecting a drive member to the substrate support;

moving the drive member to move the substrate support from a position at a distance from the target to the mean distance from the target;

providing a logic member interactive with the drive member to increase the distance the drive member moves to position the substrate support at the mean distance from the target by an amount corresponding to the target erosion resulting from the previous processing by the target of as few as one substrate.

17. The method of claim 16, further including the steps of:

determining the location of the substrate support with the logic member;

controlling the movement of the substrate support with the logic member; and locating the substrate support at the mean distance from the target as each substrate is processed.

18. The method of claim 17, wherein said logic member includes a movement sensor and an interactive computer which receives inputs from the movement sensor and transmits an output to the drive member to position the support member in response to those inputs.

19. The method of claim 18, wherein said logic member further includes a zero position sensor interactive with said computer.

20. An apparatus for positioning a substrate within a processing chamber, comprising:

a substrate support member disposed within the chamber and movable between a first position to receive the substrate thereon, an intermediate position to receive a ring thereon, and a second position to position a substrate thereon for processing;

a pedestal having a first end portion interconnected to said substrate support member and a second end portion extending from the chamber; and a drive member interconnected to said second end portion of said pedestal to move said pedestal to move said substrate support member from said first position, through said intermediate position, and into said second position;

said drive member including an interactive logic member responsive to the position of the pedestal in said chamber and which moves said pedestal to move said substrate between said first position and said second position, said logic member causing said pedestal to move at different travel speeds at different positions within the chamber.

21. The apparatus of claim 20, wherein said pedestal moves at a first speed to move said substrate support member from said first position to a position immediately below said intermediate position, and a second speed different than said first speed from the position immediately below said intermediate position to said second position.

22. The apparatus of claim 21 wherein said second speed is slower than said first speed.

23. The apparatus of claim 21, wherein said drive member includes a stepper motor and a worm drive.

24. The apparatus of claim 20, wherein said logic member includes at least one position read member.

25. The apparatus of claim 24, wherein said logic member further includes a controller, and said position read member generates a signal corresponding to the position of said substrate in said chamber.

26. A method of moving a substrate within a chamber from a lower position wherein the substrate is placed into the chamber for processing, through an intermediate position wherein a cover ring is located over the edge of the substrate, to an upper position wherein the substrate and cover ring thereon are in position for substrate processing, comprising the steps of:

moving the substrate from the lower position to a position just below the intermediate position at a first speed; and moving the substrate from the position just below the intermediate position to a second position above said intermediate position, and thereby receiving the cover ring on the substrate, at a second speed.

27. The method of claim 26, wherein said first speed is greater than said second speed.

28. The method of claim 27, further comprising moving said substrate from the second position to said upper position at a speed greater than said second speed.

29. A method of contacting a mechanical member with a substrate within a processing chamber, comprising the steps of: substrate together at a first speed; and then moving said one of said mechanical member and said substrate together at a second speed less than said first speed such that said mechanical member and said substrate contact each other as "moving a substrate support member and said substrate together at a first speed; and then moving said substrate support member and said substrate together at a second speed less than said first speed such that said substrate supported by said substrate support member contacts said mechanical member within the processing chamber."

30. An apparatus for positioning an object at multiple positions within an enclosure, comprising:

a moveable positioning member disposed at least partially within said enclosure;

said moveable positioning member moveable from a first position to an intermediate position in said enclosure, and from said intermediate position to a second position in said enclosure;

the object positionable within said enclosure to be received on said moveable positioning member at said intermediate position; and a drive member connected to said moveable positioning member and configured to move said moveable positioning member between said first position, said intermediate position and said second position at different speeds.

31. The apparatus of claim 30, wherein:

said moveable positioning member includes a first portion located in the enclosure to receive the object thereon and a second portion connected to said first portion and said drive member; and said drive member is configured to move said first portion from said first position to a position immediately adjacent said intermediate position at a first speed, and further move said first portion, from said position immediately adjacent said intermediate position and through said intermediate position, at a second speed.

32. The apparatus of claim 31, wherein said second portion is connected to said drive member outwardly of said enclosure.

33. The apparatus of claim 31, wherein the object is a ring.

34. The apparatus of claim 31, wherein the enclosure is configured as a sputter chamber, and a sputtering target is located adjacent said second position.

35. The apparatus of claim 34, wherein said second position is a fixed distance from the surface of the target, and the distance between said second position and said first position increases as the target erodes.

36. The apparatus of claim 35, wherein a substrate is receivable on said first portion at said first position.

37. A method of positioning an object on a support member in an enclosure, comprising:

locating the support member in the enclosure;

positioning the support member in a first position in the enclosure;

providing the object at an intermediate position in the enclosure;

moving the moveable support member at a first speed from the first position to a position immediately adjacent the intermediate position; and then moving the support member, at a second speed different from the first speed, from the position immediately adjacent the intermediate position through the intermediate position to locate the object on the support member.

38. The method of claim 37, wherein the object is a ring.

39. The method of claim 37, further including the step of placing a substrate into the enclosure and onto the support member when the support member is in the first position.

40. The method of claim 39, wherein said enclosure is a sputtering chamber.

41. The method of claim 40, further including the step of moving the support member from the intermediate position to a second position.

42. The method of claim 41, wherein the support member is moved from the intermediate position to the second position at a third speed.

43. The method of claim 42, wherein the first speed and the third speed are greater than the second speed.

44. The method of claim 43, wherein the first speed and the third speed are equal.

45. The method of claim 37, further including the steps of:

providing a drive member to position the support member in the enclosure;

providing an interactive control member to control the drive member.

46. The method of claim 45, further including the step of providing at least one position sensing member which is interactive with the drive member and the control member.

47. The method of claim 46, further including the steps of:

providing a signal from the control member to the drive member to move the support member away from the second position; and detecting the position of the support member at the first position with the position sensing member.

48. The method of claim 47, further including the steps of:

providing a signal from the controller to the drive member to move the support member from the first position toward the intermediate position at a first speed;

detecting the cumulative movement of the support member from the first position towards the intermediate position with the sensing member;

providing a signal from the controller to the drive member to reduce the speed of the support member to a second speed when the support member is positioned adjacent the intermediate position;

detecting the cumulative movement of the support member through the intermediate position with the sensing member;

providing a signal from the control member to the drive member to increase the speed of the support member after the support member has passed through the intermediate position; and providing a signal from the control member to the drive member to stop the movement of the drive member when the support member is positioned at the second position, the control member providing the signal after the sensing member senses the movement of the support member from the first position to the second position.

49. The method of claim 41, wherein the sputtering chamber includes a sputtering target located adjacent the second position.

50. The method of claim 49, wherein the distance between the first portion and the second position increases as the sputtering target erodes.

* * * * *

UNITED STATES PATENT AND TRADEMARK OFFICE
CERTIFICATE OF CORRECTION

PATENT NO. : 5,540,821

DATED : July 30, 1996

INVENTOR(S) : Avi Tepman

It is certified that error appears in the above-identified patent and that said Letters Patent is hereby corrected as shown.

Column 13, lines 32,-43, should read as follows:

29. A method of contacting a mechanical member with a substrate within a processing chamber, comprising the steps of: moving a substrate support member and said substrate together at a first speed; and then moving said substrate support member and said substrate together at a second speed less than said first speed such that said substrate supported by said substrate support member contacts said mechanical member within the processing chamber.

Signed and Sealed this

Second Day of September, 1997

Attest:

BRUCE LEHMAN

Attesting Officer

Commissioner of Patents and Trademarks